(12) United States Patent
Shigeta et al.

(10) Patent No.: US 9,831,152 B2
(45) Date of Patent: Nov. 28, 2017

(54) SEMICONDUCTOR DEVICE (71) Applicant: FUJI ELECTRIC CO., LTD., Kawasaki-shi, Kanagawa (JP)

(72) Inventors: Fumio Shigeta, Okaya (JP); Yoshihiro Kodaira, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/280,054

(22) Filed: Sep. 29, 2016

(65) Prior Publication Data

US 2017/0018480 A1 Jan. 19, 2017

Related U.S. Application Data (63) Continuation of application No. PCT/JP2015/075521, filed on Sep. 8, 2015.

(30) Foreign Application Priority Data

Oct. 14, 2014 (JP) ................. 2014-210178

(51) Int. Cl.
*H01L 23/373* (2006.01)
*H01L 25/07* (2006.01)
(Continued)

(52) U.S. Cl.
CPC ........ *H01L 23/3735* (2013.01); *H01L 23/053* (2013.01); *H01L 23/057* (2013.01);
(Continued)

(58) Field of Classification Search
CPC ............. H01L 23/3735; H01L 23/4006; H01L 23/057; H01L 23/053; H01L 25/18;
(Continued)

(56) References Cited

U.S. PATENT DOCUMENTS 5,410,450 A 4/1995 Iida et al.
6,078,501 A * 6/2000 Catrambone ......... H02M 7/003
174/50
(Continued)

FOREIGN PATENT DOCUMENTS

JP H05-15445 U 2/1993
JP H05-15446 U 2/1993
(Continued)

OTHER PUBLICATIONS

PCT, "International Search Report for International Application No. PCT/JP2015/075521" dated Nov. 24, 2015.

*Primary Examiner* — Michael Carter
*Assistant Examiner* — Mohammed R Alam
(74) *Attorney, Agent, or Firm* — Manabu Kanesaka (57) ABSTRACT

A control terminal 14 of a semiconductor device has a recessed portion 14c. A resin case 15 is provided with a fixing member 152 engaging with and fixing a recessed portion 14c of a control terminal 14. The fixing member 152 is constituted by a resin block portion 154 having a step portion engaging with the recessed portion 14c, a nut-housing portion 153, and a beam portion 155 integrated by linking the resin block portion 154 and the nut-housing portion 153. A resin case main body 151 to which the fixing member 152 is fixed is provided with a hollow portion enabling insertion of the resin block portion 154. The nut-housing portion 153 of the fixing member 152 and the resin block portion 154 are attached to the resin case main body 151 from one direction.

5 Claims, 8 Drawing Sheets (51) Int. Cl.
  *H01L 25/18* (2006.01)
  *H01L 23/053* (2006.01)
  *H01L 23/057* (2006.01)
  *H01L 23/40* (2006.01)
  *H01L 23/498* (2006.01)

(52) U.S. Cl.
  CPC .......... H01L 23/4006 (2013.01); H01L 25/07 (2013.01); H01L 25/18 (2013.01); *H01L 23/49822* (2013.01); *H01L 2023/4087* (2013.01); *H01L 2924/0002* (2013.01)

(58) Field of Classification Search
  CPC ............. H01L 25/07; H01L 2023/4087; H01L 23/49822; H01L 2924/0002; H01L 23/10; H01L 25/072; H01L 23/49811; H01L 23/36; H01L 23/34
  See application file for complete search history.

(56) References Cited

U.S. PATENT DOCUMENTS

| | | | |
|---|---|---|---|
| 6,297,549 B1* | 10/2001 | Hiyoshi | H01L 25/072 257/502 |
| 7,291,914 B2* | 11/2007 | Stolze | H01L 25/072 257/704 |
| 7,683,472 B2* | 3/2010 | Popp | H01L 24/72 257/666 |
| 2009/0194884 A1* | 8/2009 | Stolze | H01L 25/072 257/773 |
| 2011/0069458 A1* | 3/2011 | Nakao | H01L 25/072 361/728 |
| 2011/0291106 A1* | 12/2011 | Kikuchi | H01L 23/3107 257/77 |
| 2012/0074542 A1* | 3/2012 | Soyano | H01L 23/057 257/659 |
| 2012/0153451 A1* | 6/2012 | Hayashida | H01L 23/053 257/690 |
| 2013/0285231 A1* | 10/2013 | Kodaira | H01L 23/34 257/693 |
| 2014/0003013 A1* | 1/2014 | Yoo | H01L 25/072 361/767 |
| 2014/0168922 A1* | 6/2014 | Kodaira | H01L 25/072 361/773 |

FOREIGN PATENT DOCUMENTS

| | | |
|---|---|---|
| JP | H05-160339 A | 6/1993 |
| WO | 2012/071440 A2 | 5/2012 |
| WO | 2013/015031 A1 | 1/2013 |
| WO | 2013/027826 A1 | 2/2013 |

* cited by examiner

SEMICONDUCTOR DEVICE

CROSS-REFERENCE TO RELATED APPLICATIONS

This application is a continuation of PCT Application No. PCT/JP2015/075521, which claims priority to Japanese Patent Application No. 2014-210178, filed Oct. 14, 2014. The contents of these applications are incorporated herein by reference in their entirety.

TECHNICAL FIELD

The present invention relates to a semiconductor device.

BACKGROUND ART

Figure 12:
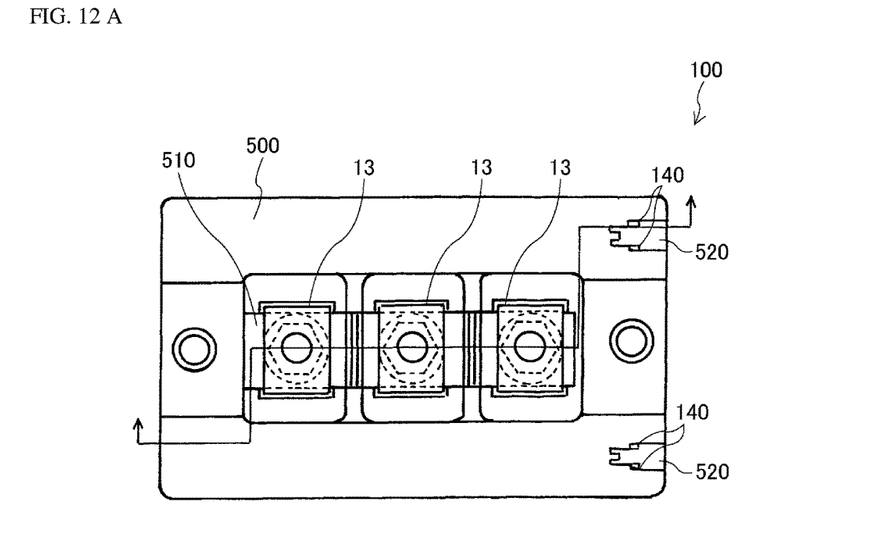
FIG. 12A is a plan view of a conventional power semiconductor module.
FIG. 12B is a cross-sectional view of the conventional power semiconductor module.
FIG. 12C is an enlarged view of a main portion in the vicinity of the upper end of the main terminal.
FIG. 12D is an enlarged view of a vicinity of the upper end of a control terminal.

A power semiconductor module described in Patent document 1 with respect to conventional semiconductor devices is depicted in FIG. 12A as a plan view, and in FIG. 12B as a cross-sectional view. The power semiconductor module 100 depicted in FIG. 12 has a multi-layered substrate 12 fixed on a heat-dissipation base 11. The multi-layered substrate 12 is a substrate constituted by a multi-layer of a metal plate, an insulation plate, and a circuit plate. The circuit plate of the multi-layered substrate 12 is bonded electrically and mechanically to the lower end of main terminals 13 by a bonding material such as solder or by direct bonding, and electrically and mechanically to the lower end of control terminals 140 by a bonding material such as solder or by direct bonding. A resin case 500 is provided so as to cover the multi-layered substrate 12 and is fixed on the heat-dissipation base 11 by adhesive.

FIG. 12C depicts an enlarged view of a main portion in the vicinity of the upper end of the main terminal 13. The upper end of the main terminal 13 takes a U-shape formed by an upper surface portion 13a and two side surface portions 13b connected to both ends of the upper surface portion. The upper end of the main terminal 13 protrudes outward through an opening of the resin case 500. A nut globe 510 which is a resin body having nuts embedded therein is inserted between the two side surface portions 13b of the main terminal 13.

FIG. 12D is an enlarged view of a vicinity of the upper end of a control terminal 140. The control terminal 140 has a first protrusion 140a and a second protrusion 140b spaced from each other. A recessed portion 140c is formed between the first protrusion 140a and the second protrusion 140b.

A resin block 520 is inserted into an opening for the control terminal 140 of the resin case 500, the resin block having a projecting step portion fitting into a recessed portion 140c for the control terminal 140. The recessed portion 140c engages with a leading-end portion of the resin block 520. Thus, the control terminal 140 is aligned precisely in a horizontal direction and inhibited from moving in upward and downward directions due to an external load.

RELATED ART DOCUMENT

Patent Document

Patent document 1: WO 2012/071440

SUMMARY OF THE INVENTION

Problems to be Solved by the Invention

In the semiconductor device described in Patent document 1, the insertion direction of the nut globe to be attached to the resin case and that of the resin block are different from each other. Accordingly, when the semiconductor device is produced, the process of attaching the nut globe to the resin case and that of attaching the resin block thereto must be carried out separately, requiring time and effort for the attachment work.

The present invention is to solve the above described problem advantageously, and has an object to provide a semiconductor device capable of reducing the time and effort for the attachment work when a semiconductor device, for example, a power semiconductor module is produced.

Means for Solving the Problems

The semiconductor device of the present invention is provided with a main terminal and a control terminal each bonded to a multi-layered substrate, and a resin case which has an opening penetrated by the control terminal and covers the multi-layered substrate. The control terminal has a recessed portion between the multi-layered substrate and the opening of the resin case. The resin case has a fixing member and a resin case main body to which the fixing member can be attached. The fixing member includes a resin block portion having a projecting step portion engaging with the recessed portion of the control terminal, a nut-housing portion having a nut embedded therein to be aligned to the main terminal, and a beam portion integrated by linking the resin block portion and the nut-housing portion. The resin case main body is provided with a hollow portion into which the resin block portion can be inserted, allowing the nut-housing portion and the resin block portion to be attached thereto from one direction.

Effects of the Invention

According to the semiconductor device of the present invention, the time and effort for the attachment work can be reduced when the semiconductor device is produced.

MODE FOR CARRYING OUT THE INVENTION

Hereinafter, embodiments of the semiconductor device of the present invention are specifically explained with reference to the drawings. In the following description, terms "upper" and "lower" mean the positional relation between upper and lower positions on the pages of the drawings and do not mean that of actually upper and lower positions under use conditions.

Embodiment 1

Figure 1:
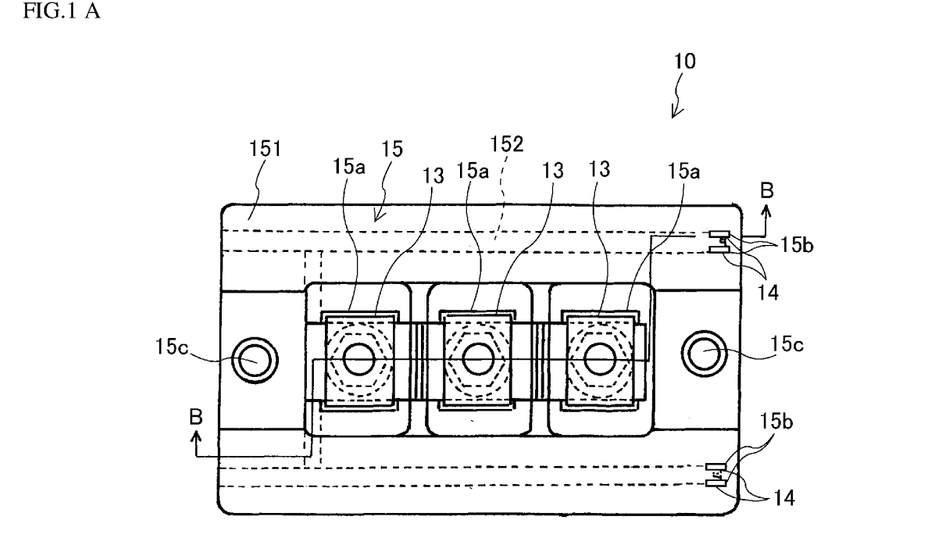
FIG. 1A is a plan view of a power semiconductor module of Embodiment 1 of the invention.
FIG. 1B is a cross-sectional view along the B-B line in FIG. 1A.
FIG. 1C is an enlarged view of a main portion in the vicinity of the upper end of the main terminal of Embodiment 1 of the invention.
FIG. 1D is an enlarged view of a vicinity of the upper end of the control terminal of Embodiment 1 of the invention.

FIG. 1 is an explanatory drawing of a power semiconductor module 10 which is one embodiment of the semiconductor device of the present invention. In FIG. 1, FIG. 1A is a plan view of the power semiconductor module 10, and FIG. 1B is a cross-sectional view along the B-B line in FIG. 1A. The power semiconductor module 10 is provided with a heat-dissipation base 11, a multi-layered substrate 12, main terminals 13, control terminals 14, and a resin case 15.

The heat-dissipation base 11 is surmounted by a multi-layered substrate 12 fixed thereto. The multi-layered substrate 12 is a substrate constituted by a multi-layer of a metal plate, an insulation plate, and a circuit plate, and is fixed to the heat-dissipation base 11 by a non-illustrated bonding material, for example, solder, with the metal plate facing the heat-dissipation base. The circuit plate of the multi-layered substrate 12 has patterns of a given electric circuit which are selectively formed thereon. The circuit plate of the multi-layered substrate 12 is surmounted by a non-illustrated power semiconductor chip bonded electrically and mechanically thereto by a bonding material. The power semiconductor chip is also electrically connected to the circuit plate of the multi-layered substrate 12, the main terminals 13, and the control terminals 14 by a non-illustrated wiring member. The power semiconductor chip and the wiring member are omitted in FIG. 1 since they are not characteristic parts of the present invention. The circuit plate of the multi-layered substrate 12 is bonded electrically and mechanically to the lower end of the main terminals 13 by a bonding material such as solder or by direct bonding, and electrically and mechanically to the lower end of the control terminals 14 by a bonding material such as solder or direct bonding.

The resin case 15 is provided so as to cover the multi-layered substrate 12 and is fixed to the heat-dissipation base 11 by adhesive. The resin case 15 is constituted by a resin case main body 151 and a fixing member 152 attached to the resin case main body 151. The resin case 15 has openings 15a allowing outward protrusion (penetration) of the upper end of the main terminals 13, openings 15b allowing outward protrusion (penetration) of the upper end of the control terminals 14, and tapped screw holes 15c. The illustrated example has three main terminals 13 and four control terminals 14.

FIG. 1C depicts an enlarged view of a main portion in the vicinity of the upper end of the main terminal 13. The upper end of the main terminal 13 has a U-shape formed by an upper surface portion 13a and two side surface portions 13b connecting to both ends of the upper surface portion. The upper end of the main terminal 13 protrudes outward through the opening of the resin case 15. The upper surface portion 13a has a bolt hole 13c formed therein. A nut-housing portion 153 of the fixing member 152 constituting the resin case 15 is inserted between the two side surface portions 13b of the main terminal 13.

FIG. 1D depicts an enlarged view of a vicinity of the upper end of the control terminal 14. The control terminal 14 has a first protrusion 14a and a second protrusion 14b spaced from each other between the multi-layered substrate 12 and the opening 15b of the resin case 15. A recessed portion 14c is formed between the first protrusion 14a and the second protrusion 14b. The recessed portion 14c engages with a leading-end portion of a resin block portion 154 of the fixing member 152 of the resin case 15. Thus, the control terminal 14 is precisely aligned in a horizontal direction, in other words, in a direction parallel to an in-plane direction of the front surface of the heat-dissipation base 11, and is inhibited from moving in upward and downward directions due to an external load.

FIG. 2A is a plan view of the fixing member 152 provided with a nut-housing portion 153 and resin block portions 154. In addition, FIG. 2B is a side view of the fixing member 152. The fixing member 152 has a shape such that the nut-housing portion 153 and two resin block portions 154 each provided on the both sides of the nut-housing portion 153 are connected by a beam portion 155. The beam portion 155 links the nut-housing portion 153 and the two resin block portions 154 on one of the longitudinal end sides of the fixing member 152. The nut-housing portion 153 and the resin block portions 154 each have an elongated bar (box) shape. The longitudinal direction of the nut-housing portion 153 and that of the resin block portions 154 are approximately parallel to each other. Thus, the fixing member 152 can be attached to the resin case main body 151 from one direction, specifically from the left direction on the page in FIGS. 1A and 2A to the right direction.

The nut-housing portion 153 is a resin body having a nut 156 embedded for connecting an external wiring to a main terminal 13, and in this embodiment, three nuts 156 corresponding to three main terminals 13 are arranged in a straight line at the same intervals as those of the main terminals 13. The nuts 156 of the nut-housing portion 153 are aligned to each of the main terminals 13. Connection of the main terminal 13 to the external wiring is carried out by thread-connecting a non-illustrated bolt or screw to the nut 156 of the nut-housing portion 153 via the bolt hole 13c of the main terminals 13.

Figure 3:
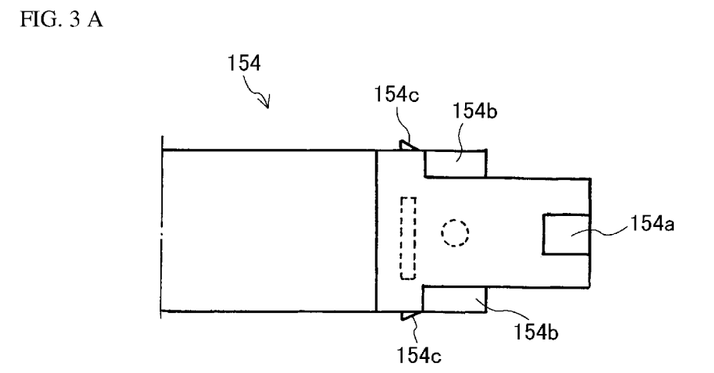
FIG. 3A is a top view of the leading-end portion of the resin block portion.
FIG. 3B is a bottom view of the leading-end portion of the resin block portion.
FIG. 3C is a side view of the leading-end portion of the resin block portion.

FIG. 3 is an enlarged view of the leading-end portion of the resin block portion 154. FIG. 3A is a top view of the leading-end portion of the resin block portion 154, FIG. 3B is a bottom view of the leading-end portion of the resin block portion 154, and FIG. 3C is a side view of the leading-end portion of the resin block portion 154. A trench 154a to engage with the resin case is formed on the leading-end portion of the resin block portion 154. Step portions 154b are formed on the both side surfaces of the resin block portion 154, the step portions having a projecting portion engaging with the recessed portions 14c of the control terminal 14. One protrusion 154c is also formed on each of the both side surfaces. A protrusion 154d is formed on the bottom surface of the resin block portion 154.

The step portion 154b formed on the both side surfaces of the lead-end portion of the resin block portion 154 enables the engagement of the recessed portion 14c of the control terminal 14 which is located on each of the step portions 154b. Thus, the one resin block portion 154 can engage with and fix the two control terminals 14. The protrusions 154c and 154d formed on the side surfaces and the bottom surface of the leading-end portion of the resin block portion 154 fix the resin block portion 154 by engaging with recessed portions formed on the internal surface of a hollow for the resin block portion 154 provided in the resin case main body 151.

Figure 2:
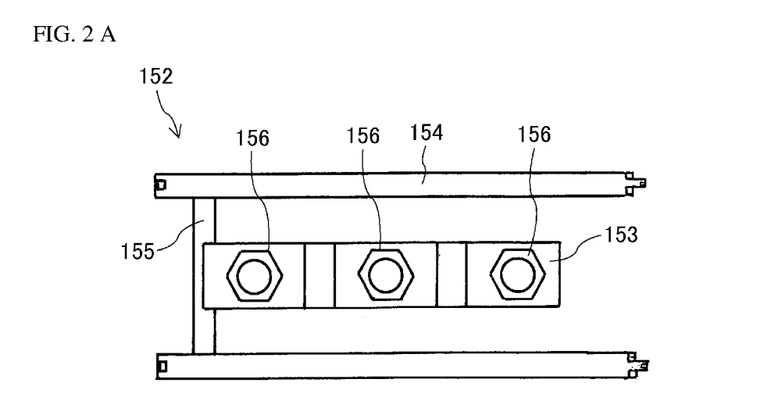
FIG. 2A is a plan view of the fixing member provided with a nut-housing portion and resin block portions.
FIG. 2B is a side view of a fixing member.

The beam portion 155 of the fixing member 152 depicted in FIG. 2 is composed of resin and connected to both of the nut-housing portion 153 and the resin block portions 154. The beam portion 155 integrates the nut-housing portion 153 and the resin block portions 154. When attached to a resin case main body 151, the beam portion 155 is desirably located so as not to interfere in not only the main terminals 13 but also the tapped screw holes 15c of the resin case 15. Accordingly, the beam portion 155 is provided between the main terminal 13 and the tapped screw hole 15c in this embodiment depicted in FIG. 1, 2. The beam portion 155 can be integrally formed along with the nut-housing portion 153 and the resin block portions 154 by molding.

Figure 4:
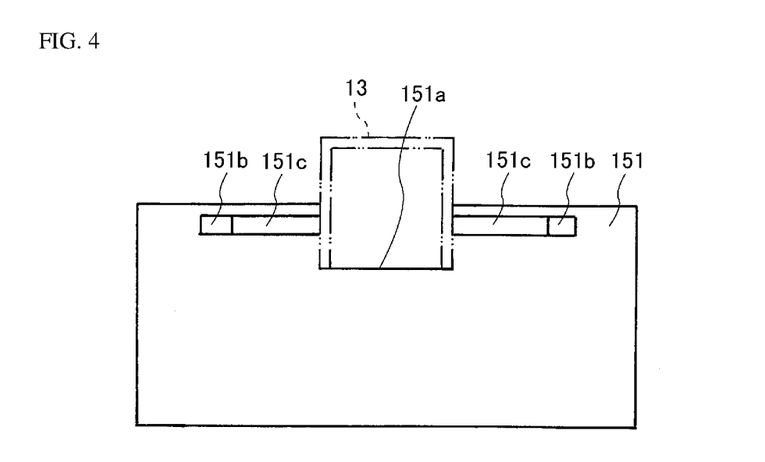
FIG. 4 is a side view of a resin case main body.

FIG. 4 depicts a side view of a resin case main body 151. On a side surface of the resin case main body 151 are formed a recessed portion 151a surmounted by the nut-housing portion 153 of a fixing member 152, openings 151b through which the resin block portions 154 are inserted, and trenches 151c to which the beam portion is attached. Thus, the fixing member 152 can be attached to and inserted into the resin case main body 151 from one direction. Hollow portions are formed which extend in a horizontal direction of the resin case 15 from the two openings 151b for the resin block portions 154 formed on one side of the resin case main body 151, and the hollow portions reach the control terminals 14. The resin block portions 154 are inserted into the hollow portions and fixes the control terminals 14 (See the plan view of FIG. 1A). For this reason, the hollow portions have a cross-sectional shape such that the resin block portions 154 can be inserted therein. Furthermore, the extension directions of the two hollow portions corresponding to the two resin block portions 154 are approximately parallel to each other.

The resin case main body 151 and the fixing member 152 are fixed by engagement of the protrusions 154c and 154d of the resin block portions 154 depicted in FIG. 2 with recessed portions formed on the internal surface of the above-mentioned hollow portions of the resin case main body 151. Accordingly, the resin case main body 151 and the fixing member 152 can be fixed without adhesive. However, this embodiment does not exclude fixing the resin case main body 151 and the fixing member 152 by adhesive.

The fixing member 152 depicted in FIG. 2 has two resin block portions 154 provided with protrusions 154c and 154d in the vicinity of each leading-end portions thereof. However, even in the case that only one of the two resin block portions 154 is provided with the protrusions 154c and 154d on the leading-end thereof, the resin case main body 151 and the fixing member 152 can be fixed.

Figure 5:
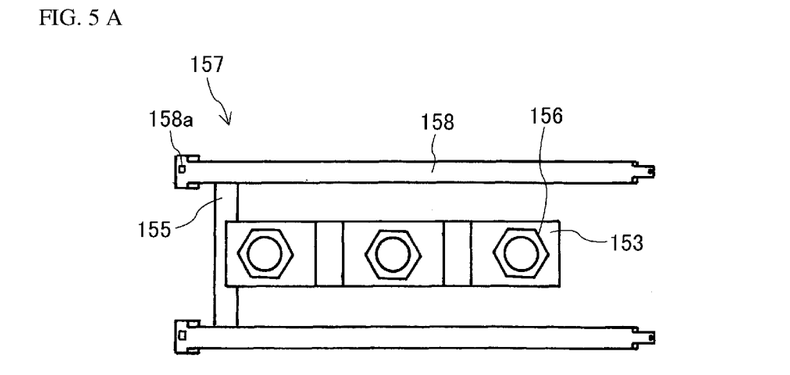
FIG. 5A is a plan view of a fixing member of a variation of Embodiment 1 of the invention.
FIG. 5B is a side view of a fixing member of a variation of Embodiment 1 of the invention.

FIG. 5 depicts a variation of this embodiment. A fixing member 157 depicted in FIG. 5A as a plan view and in FIG. 5B as a side view has resin block portions 158 the rear-end portion of which is provided with protrusions 158a for fixing a resin case main body 151. As can be understood by this variation, it does not matter whether the location of the protrusions for engaging the fixing member with the resin case main body is on the leading-end side or the rear-end side.

The semiconductor device of this embodiment can be fixed by attachment from one direction to the resin case main body because the nut-housing portion 153 and the resin block portions 158 are integrally constituted by the beam portion 155. Further, the nut-housing portion 153 and the resin block portions 158 can be fixed at the same time. Accordingly, when the semiconductor device is produced, it enables reducing time and effort for the attachment work.

Embodiment 2

Figure 6:
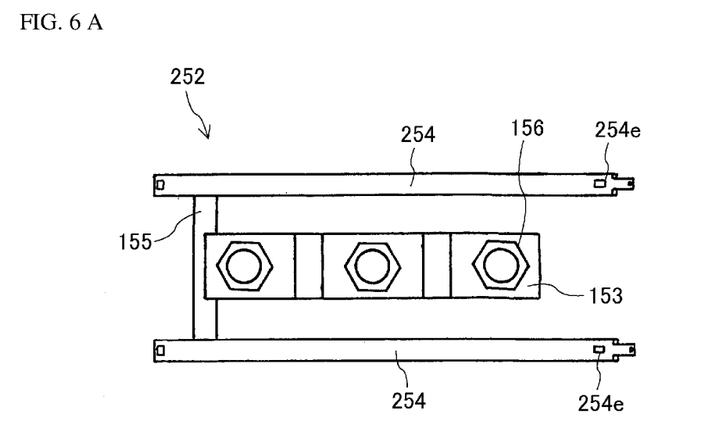
FIG. 6A is a plan view of a fixing member of Embodiment 2 of the invention.
FIG. 6B is a side view of a fixing member of Embodiment 2 of the invention.
Figure 7:
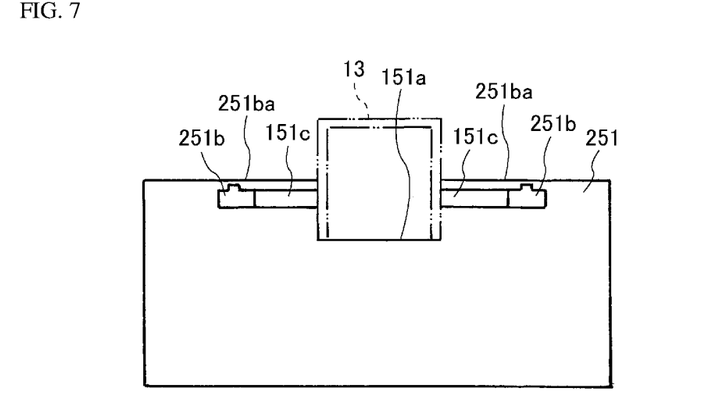
FIG. 7 is a side view of a resin case main body.

Another embodiment of the semiconductor device of the present invention is explained with reference to FIG. 6 and FIG. 7. The power semiconductor module of this embodiment has substantially the same configurations as that of the power semiconductor module 10 depicted in FIG. 1. Accordingly, FIG. 6 illustrates a fixing member 252 of this embodiment constituting the resin case, and FIG. 7 illustrates a resin case main body 251 of this embodiment, as characteristic configurations of the embodiment. The other configurations are substantially the same as those of the power semiconductor module 10 depicted in FIG. 1. In FIG. 6 and FIG. 7, the same members as those in the above-described embodiment are denoted by the same symbols. Accordingly, explanations duplicated with those already given in the above embodiment will be omitted.

The semiconductor device of this embodiment depicted in FIG. 6, and FIG. 7 has a fixing member 252 constituted by a nut-housing portion 153, resin block portions 254, and a beam portion 155. The resin block portions 254 have a protrusion 254e on the upper surface thereof. A resin case main body 251 is provided with trenches on the upper surface among the internal surfaces of hollow portions into which the resin block portions 254 are inserted, the trenches guiding the protrusion 254e of the resin block portions 254. The trenches appear as hollow portions 251ba on the upper side of openings 251b in FIG. 7.

The two resin block portions 254 are bonded to each other by the beam portion 155. When the resin block portions 254 of the fixing member 252 are inserted from the openings 251b of resin case main body 251, the extension direction of the two resin block portions 254 are not necessarily kept parallel to each other. Even in this case, according to this embodiment, since the protrusions 254e formed in the resin block portions 254 are guided by the trenches of the hollow portions, the resin block portions 254 can be prevented from being obstructed due to their contact to the internal surface of the hollow portions, allowing the resin block portions 254 to be inserted smoothly.

In this embodiment depicted in FIG. 6 and FIG. 7, the protrusion 254e is formed on the upper surface of the resin block portion 254. However, the location where the protrusion 254e is formed is not limited to the upper surface of the resin block portion 254. In addition, the location of protrusion 254e in the longitudinal direction of the resin block portion 254 also is not limited particularly. However, the protrusion 254e is preferably formed in the vicinity of the leading-end portion of the resin block portion 254 from the viewpoint of smooth guidance of the resin block portion 254.

Further in FIG. 6 and FIG. 7, the protrusion 254e is formed on each of the two resin block portions 254, but the protrusion may be formed on the only one of the resin block portions 254.

Embodiment 3

Figure 8:
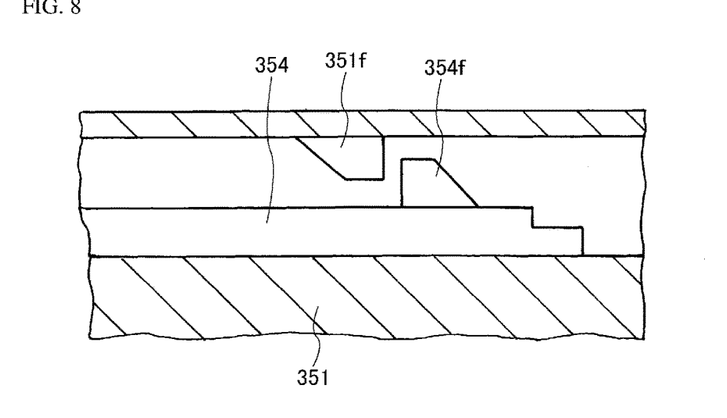
FIG. 8 is a partially expanded cross-sectional view of a resin case main body and a fixing member of Embodiment 3 of the present invention.

Another embodiment of the present invention is explained with reference to FIG. 8. The power semiconductor module of this embodiment has substantially the same configurations as those of the power semiconductor module 10 depicted in FIG. 1. Accordingly, FIG. 8 depicts a partially expanded cross-sectional view of a hollow portion of a resin case main body 351 constituting the resin case and a leading-end portion of a resin block 354 of the fixing member inserted into the hollow portion, as a characteristic configuration of this embodiment. The other configurations are substantially the same as those of the power semiconductor module 10 depicted in FIG. 1.

In FIG. 8, a stopper 351f is formed on the internal surface of the hollow portion of the resin case main body 351. Further, the resin block 354 has a protrusion 354f getting beyond and engaging with the stopper 351f.

In the previous embodiment depicted in FIG. 1, protrusions 154c, 154d are formed on the leading-end portion of the resin block portions 154, but in this embodiment, the protrusion 354f is formed not on the leading-end portion of the resin block 354 but between the leading-end portion and the rear-end portion. By engagement of this protrusion 354f with the above-mentioned stopper, the resin block of the fixing member is fixed to the resin case main body.

As is obvious in this embodiment, the location of engaging means for fixing the resin block of the fixing member does not matter.

As a variation of this embodiment, the configuration may also be such that the protrusion 254e of the resin block portion 254 explained in the previous embodiments and depicted in FIG. 6 doubles as the protrusion 354f for engaging the stopper 351f in the hollow portion of this embodiment.

Embodiment 4

Figure 9:
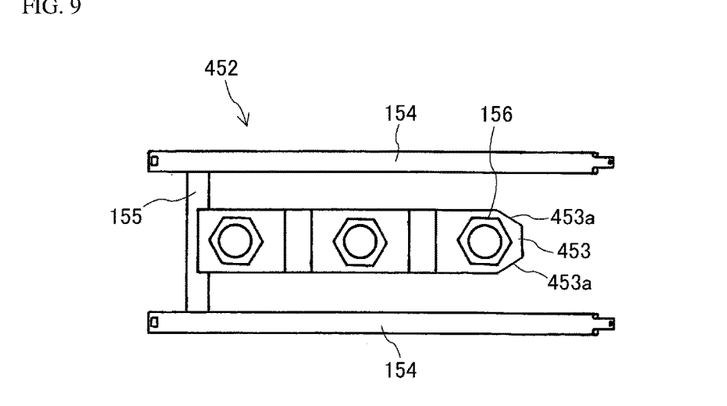
FIG. 9 is a plan view of a fixing member of Embodiment 4 of the present invention.

Another embodiment of the present invention is explained with reference to FIG. 9. The power semiconductor module of this embodiment has substantially the same configurations as those of the power semiconductor module 10 depicted in FIG. 1. Accordingly, FIG. 9 illustrates a plan view of a fixing member 452 constituting the resin case as a characteristic configuration of this embodiment. The other configurations are substantially the same as those of the power semiconductor module 10 depicted in FIG. 1.

The fixing member 452 depicted in FIG. 9 has a nut-housing portion 453 having tapers 453a on the leading-end portion thereof. Because the nut-housing portion 453 has the tapers 453a on the leading-end portion thereof, the nut-housing portion 453 can be inserted smoothly between two side surface portions 13b forming the U-shape of the upper end of the main terminals 13.

As previously explained with reference to FIG. 6 and FIG. 7 in Embodiment 2, this embodiment may also be configured to provide a protrusion formed on the upper surface of the resin block portions 154 and a trench formed in the hollow portions of the resin case main body into which the resin block portions 154 are inserted, so that the trench guides the protrusions. Such a configuration inhibits the resin block portions 154 from being obstructed due to the contact to the internal surface of the hollow portions, enabling smooth insertion of the fixing member 452 into the resin case main body.

Figure 10:
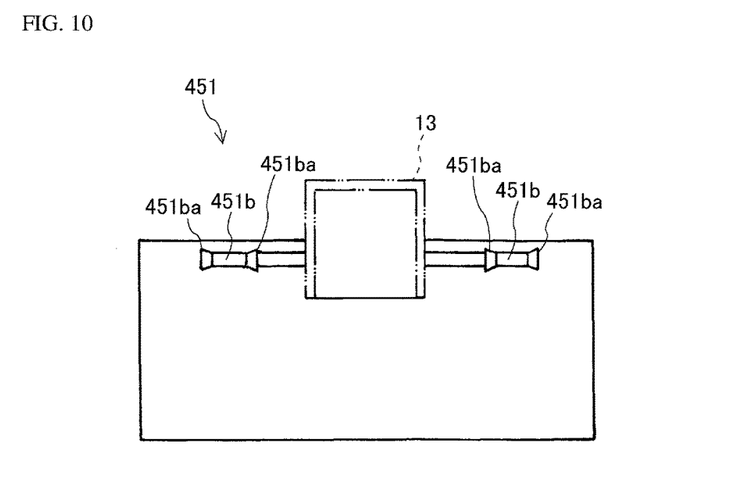
FIG. 10 is a side view of a resin case main body of Embodiment 4 of the present invention.

FIG. 10 is a side view of a resin case main body 451 constituting the resin case as another example of this embodiment. The resin case main body 451 of FIG. 10 has openings 451b having tapers 451ba formed thereon, into which openings the resin block portions 154 of the fixing member 452 of FIG. 9 are inserted. Thus, the resin block portions 154 can be smoothly inserted into the hollow portions.

Although the semiconductor device of the present invention was specifically explained by the aid of the drawings and Embodiments as described above, the present invention is not limited to the description of the embodiments and of the drawings, and many variations are allowable without departing from the spirit of the present invention.

For example, resin block portions of the fixing member are not limited to be those inserted into the hollow portions formed in the resin case main body. The configuration may also be such that a trench for guiding the resin block portion, formed on the upper surface of the resin case main body, guides the resin block portion along this trench so as to fix the control terminal. In this configuration, the resin block portion is exposed on the upper surface of resin case.

Figure 11:
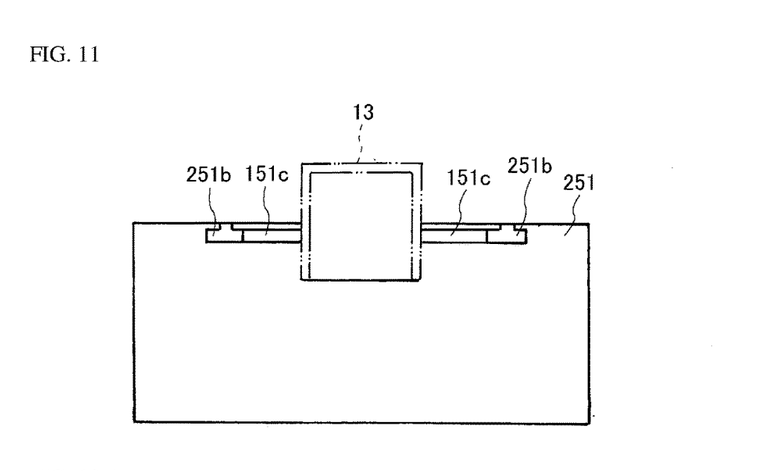
FIG. 11 is a side view of a resin case main body of a variation.

FIG. 11 is a variation of the resin case main body of FIG. 7, and a part of the upper side of the openings 251b is also opened to the upper surface of the resin case and forms a slit. Thus, the protrusions 254e of the resin block portions 254 of the fixing member 252 in FIG. 6 are guided by the slits.

DESCRIPTION OF SYMBOLS 10 power semiconductor module
12 multi-layered substrate
13 main terminal
14 control terminal
14c recessed portion
15 resin case
15b opening
151, 251, 351 resin case main body
151b, 251b hollow portion
251ba trench
351f stopper
152, 252, 452 fixing member
153, 453 nut-housing portion
453a taper
154, 254, 354 resin block portion
254e protrusion
354f protrusion
154c, 154d protrusion
155 beam portion
156 nut

The invention claimed is:

1. A semiconductor device comprising:
a main terminal and a control terminal each connected to a multi-layered substrate; and
a resin case having an opening penetrated by the control terminal and covering the multi-layered substrate,
wherein the control terminal comprises a recessed portion between the multi-layered substrate and the opening of the resin case,
wherein the resin case comprises a fixing member and a resin case main body to which the fixing member can be attached,
wherein the fixing member comprises a resin block portion comprising a projecting step portion engaging with a recessed portion of the control terminal, a nut-housing portion comprising a nut embedded to be aligned to the main terminal, and a beam portion integrated by linking the resin block portion and the nut-housing portion, wherein the resin case main body comprises a hollow portion capable of insertion of the resin block portion and enables the nut-housing portion and resin block portion to be attached from one direction.

2. The semiconductor device according to claim 1, wherein the resin block portion of the fixing member comprises a protrusion engaging with the resin case main body.

3. The semiconductor device according to claim 1, wherein the hollow portion of the resin case main body comprises a trench formed on an internal surface thereof, which trench guides the resin block portion of the fixing member, wherein the resin block portion of the fixing member comprises a protrusion guided by the trench.

4. The semiconductor device according to claim 1, wherein the hollow portion of the resin case main body comprises a stopper of fixing the resin block portion of the fixing member formed on the internal surface thereof, wherein the resin block portion of the fixing member comprises a protrusion engaging with the stopper.

5. The semiconductor device according to claim 1, wherein the nut-housing portion of the fixing member comprises a taper formed on a leading-end thereof.

\* \* \* \* \*